(12) United States Patent
Chien

(10) Patent No.: US 8,222,599 B1
(45) Date of Patent: Jul. 17, 2012

(54) PRECISE METROLOGY WITH ADAPTIVE MILLING

(75) Inventor: Chester Xiaowen Chien, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 635 days.

(21) Appl. No.: 12/424,323

(22) Filed: Apr. 15, 2009

(51) Int. Cl.
*H01J 37/30* (2006.01)
*H01J 37/252* (2006.01)
*G01N 23/00* (2006.01)

(52) U.S. Cl. ..... 250/307; 250/306; 250/311; 250/492.2; 250/492.21

(58) Field of Classification Search .......... 250/307, 250/306, 311, 492.2, 492.21
See application file for complete search history.

(56) References Cited

U.S. PATENT DOCUMENTS

| | | | |
|---|---|---|---|
| 6,521,902 B1 | 2/2003 | Chang et al. | |
| 6,650,419 B2 * | 11/2003 | Hill | 356/500 |
| 6,947,148 B2 * | 9/2005 | Hill | 356/493 |
| 7,081,369 B2 | 7/2006 | Scott et al. | |
| 7,186,574 B2 | 3/2007 | Dulay et al. | |
| 7,208,965 B2 * | 4/2007 | Zhang et al. | 324/754.22 |
| 7,308,334 B2 | 12/2007 | Tasker et al. | |
| 7,372,016 B1 | 5/2008 | Tortonese et al. | |
| 8,097,846 B1 * | 1/2012 | Anguelouch et al. | 250/307 |
| 2003/0093894 A1 | 5/2003 | Dugas et al. | |
| 2006/0073618 A1 | 4/2006 | Dulay et al. | |
| 2006/0286772 A1 | 12/2006 | Pearl | |

FOREIGN PATENT DOCUMENTS

| | | |
|---|---|---|
| JP | 11-258129 | 9/1999 |
| JP | 2005-265424 | 9/2005 |
| WO | 2005/050691 A2 | 6/2005 |
| WO | 2008/111365 A1 | 9/2008 |

* cited by examiner

*Primary Examiner* — Nikita Wells

(57) ABSTRACT

A method of measuring a three-dimensional device in a wafer is provided. The method comprises the step of forming a trench in the wafer. The trench has a facet passing through the three-dimensional device a predetermined offset from a desired image position. The method further comprises iteratively, until a remaining distance between the facet and the desired image position is less than a predetermined threshold, adjusting one or more parameters of a polishing beam based on the remaining distance, polishing the facet with the polishing beam to position the facet closer to the desired image position, and measuring the remaining distance.

18 Claims, 6 Drawing Sheets

PRECISE METROLOGY WITH ADAPTIVE MILLING

FIELD OF THE INVENTION

The present invention generally relates to metrology and, in particular, relates to precise metrology with adaptive milling.

BACKGROUND OF THE INVENTION

The performance of many devices that are fabricated using semiconductor methods is critically dependent upon the three-dimensional (3D) structure thereof. For example, the performance of a perpendicular magnetic recording (PMR) write pole is highly dependent upon the 3D shape of the write pole near the air bearing surface (ABS), the nose length, and pole flare and/or pinching. To obtain information about the efficacy of manufacturing methods of these and other devices, it is desirable to measure the 3D structure of these devices when comparing the performance of different designs.

One approach to measuring the 3D structure of a device in a wafer involves a "slice and view" (SnV) method employing a dual beam Focused-Ion-Beam Scanning Electron Microscope (FIB/SEM). In this method, the FIB is employed to make a cut or trench in the 3D structure, a facet of which is then imaged with the SEM. Unfortunately, the accuracy with which the initial cut or trench can be placed is limited by the hardware, and may be sufficiently large to preclude precisely imaging a desired plane. For example, if the initial placement has an uncertainty of 25 nm, the precise imaging of an ABS of a PMR write pole may be rendered difficult, as many different poles may have to be cut before a facet is formed through one acceptably close (e.g., within 5 nm) to the ABS thereof.

SUMMARY OF THE INVENTION

Various aspects of the subject disclosure solve the foregoing problem by providing metrology methods for measuring a three-dimensional device in a wafer. An initial cut is made intentionally shy of a desired image plane, and the facet is polished closer to the desired plane by adaptively adjusting the polishing beam parameters based upon a measured remaining distance between the facet and the desired image plane.

According to one aspect of the subject disclosure, a method of measuring a three-dimensional device in a wafer is provided. The method comprises the step of forming a trench in the wafer. The trench has a facet passing through the three-dimensional device a predetermined offset from a desired image position. The method further comprises iteratively, until a remaining distance between the facet and the desired image position is less than a predetermined threshold, adjusting one or more parameters of a polishing beam based on the remaining distance, polishing the facet with the polishing beam to position the facet closer to the desired image position, and measuring the remaining distance.

According to another aspect of the subject disclosure, a method of measuring a three-dimensional device in a wafer is provided. The method comprises the step of forming a trench in the wafer. The trench has a facet passing through the three-dimensional device a predetermined offset from a desired image position. The method further comprises the steps of adjusting one or more parameters of a polishing beam based on the predetermined offset, polishing the facet with the polishing beam to position the facet closer to the desired image position, measuring a remaining distance between the facet and the desired image position, adjusting one or more parameters of the polishing beam based on the remaining distance, polishing the facet with the polishing beam to position the facet closer to the desired image position, and imaging the facet.

According to another aspect of the subject disclosure, a machine readable medium carrying one or more sequences of instructions for measuring a three-dimensional device in a wafer is provided. Execution of the one or more sequences of instructions by one or more processors causes the one or more processors to perform the step of forming a trench in the wafer. The trench has a facet passing through the three-dimensional device a predetermined offset from a desired image position. Execution of the one or more sequences of instructions by one or more processors causes the one or more processors to further perform the steps of iteratively, until a remaining distance between the facet and the desired image position is less than a predetermined threshold, adjusting one or more parameters of a polishing beam based on the remaining distance, polishing the facet with the polishing beam to position the facet closer to the desired image position, and measuring the remaining distance.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1:
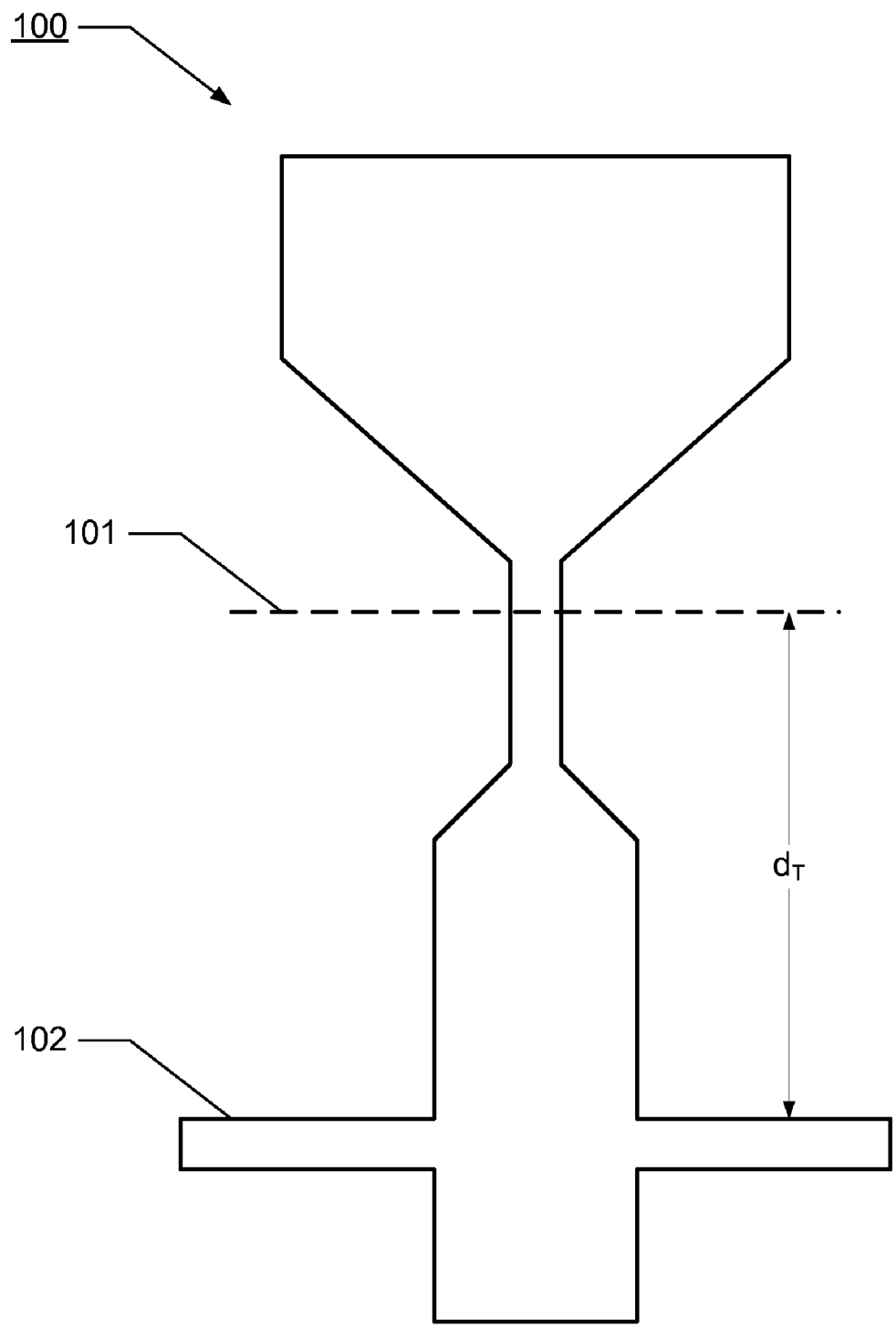
FIG. 1 illustrates an overhead view of a three-dimensional device in a wafer in accordance with one aspect of the subject disclosure.

FIG. 1 illustrates an overhead view of a three-dimensional device 100 in a wafer in accordance with one aspect of the subject disclosure. In the present exemplary embodiment, device 100 is a PMR write pole for a magnetic recording device. Device 100 includes an air bearing surface 101, at which a cross-sectional view of device 100 is desired (e.g., to determine a geometry thereof). Device 100 also includes a fiducial structure 102 a known distance $d_T$ from air bearing surface 101.

Figure 2:
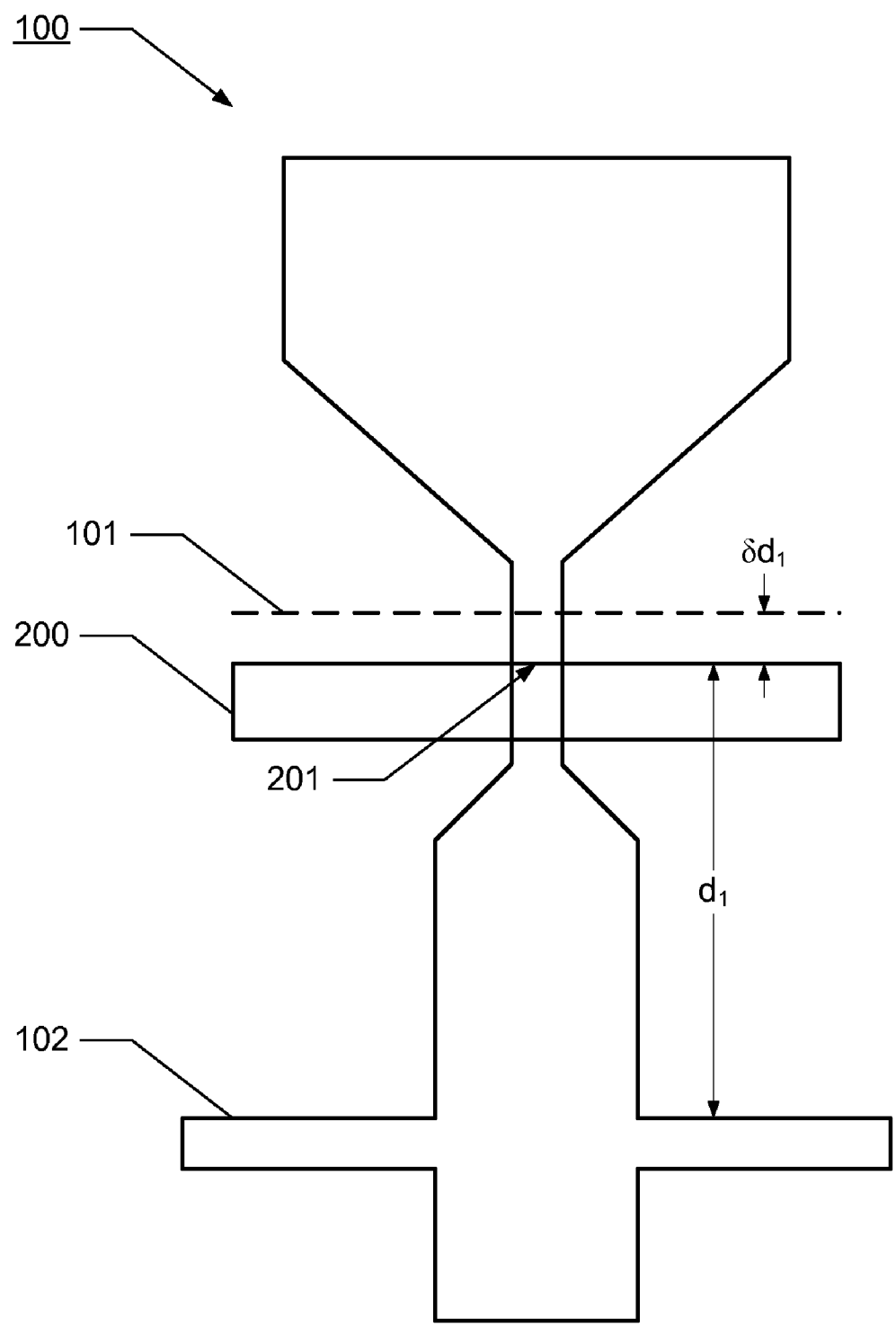
FIG. 2 illustrates an overhead view of a trench formed with respect to a three-dimensional device in a wafer in accordance with one aspect of the subject disclosure.

As the distance between fiducial structure 102 and air bearing surface 101 is known a priori (e.g., being inherent to the design of device 100), the initial position of a trench formed by FIB can be selected with a facet formed intentionally shy of ABS 101 (the desired image plane). This can be seen with reference to FIG. 2, which illustrates an overhead view of a trench 200 formed with respect to device 100 in accordance with one aspect of the subject disclosure. Trench 200 includes a facet 201 a distance $d_1$ from fiducial 102, and therefore a remaining distance $\delta d_1$ from ABS 101 (where $\delta d_1 = d_T - d_1$). Distance $\delta d_1$ is selected to be more than an uncertainty of positioning associated with the FIB device used to make trench 200 (e.g., where the FIB device has a positional uncertainty of 25 nm, $\delta d_1$ may be selected to be greater than 25 nm, to ensure that facet 201 is not positioned closer to the yoke than ABS 101). Positioning facet 201 intentionally shy of ABS 101 in this way allows the position of facet 201 to be adjusted closer to ABS 101 using a more precise polishing step, with polishing beam parameters selected based upon remaining distance $\delta d_1$.

For example, in accordance with one aspect of the subject disclosure, a polishing box (e.g. a region targeted by the FIB polishing beam) may be positioned according to the equation $d_2 = d_1 + \delta d_1 - \beta(I_0 - I)$, where $d_2$ represents the upper limit of the polishing box (and therefore the targeted position of the adjusted facet), $\beta$ is a diameter of the polishing beam, $I_0$ is an initial intensity of the polishing beam, and $I$ is an adjusted intensity of the polishing beam. The intensity $I$ of the polishing beam may be adjusted based upon the remaining distance $\delta d_1$ to ensure that the adjusted position of the facet is still shy of the ABS, in accordance with one aspect of the subject disclosure. Once the polishing is complete, the facet of the trench may be moved closer to (but still shy of) the air bearing surface of the device.

Figure 3:
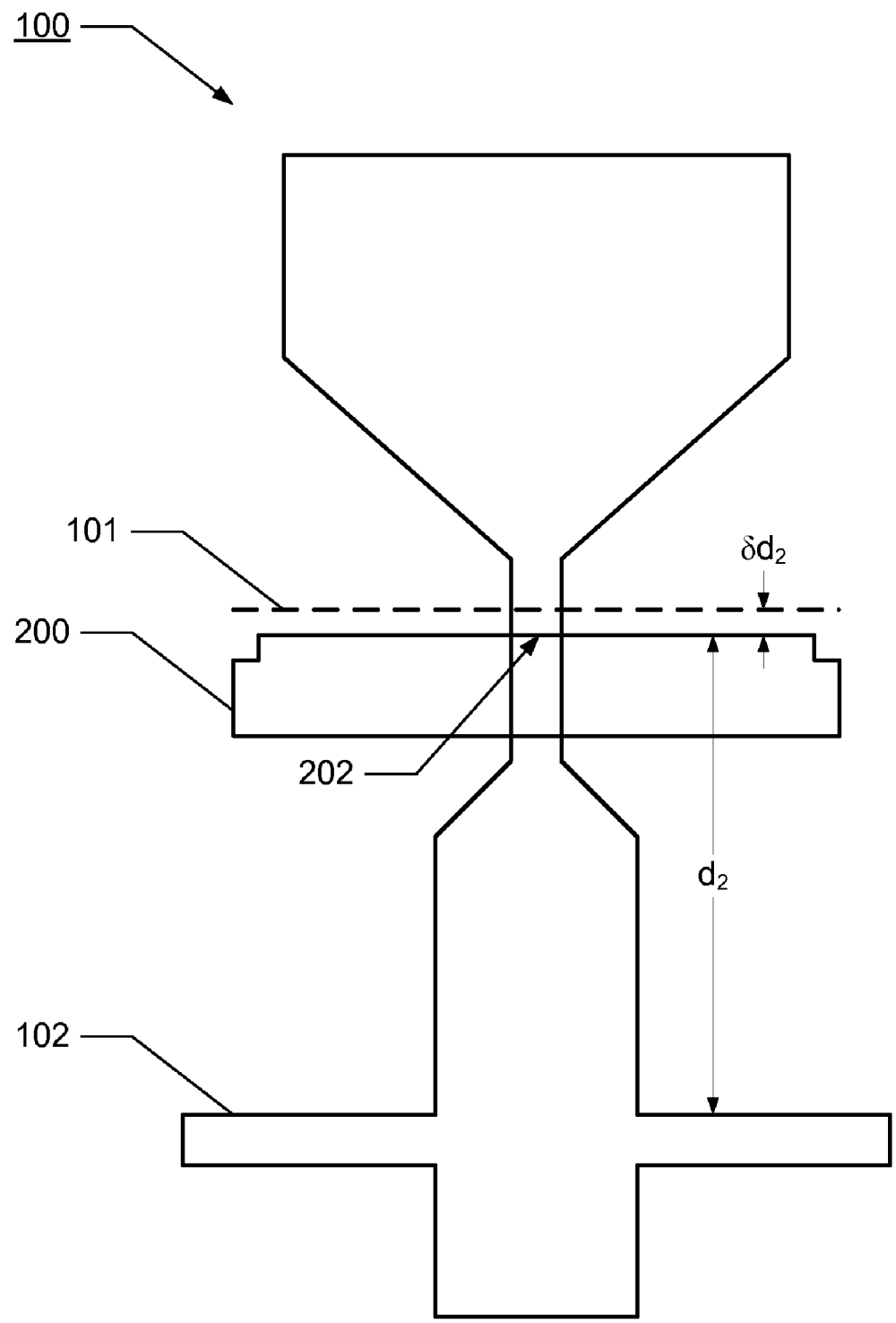
FIG. 3 illustrates an overhead view of a trench formed with respect to a three-dimensional device in a wafer in accordance with one aspect of the subject disclosure.

This may be more easily understood with reference to FIG. 3, in which an overhead view of trench 200 and device 100 is illustrated in accordance with one aspect of the subject disclosure. As can be seen with reference to FIG. 3, the upper facet 202 of trench 200 has been moved closer to ABS 101 (e.g., $\delta d_2 < \delta d_1$). After the polishing step described above, the remaining distance $\delta d_2$ may be measured, as the accuracy of the polishing beam, while better than that of the trenching beam, may still be insufficient to rely upon the value predicted by the foregoing equation. After measuring $\delta d_2$, it may be necessary to perform another polishing step to move the upper facet of trench 200 sufficiently close to ABS 101 to obtain a desired image thereof. For example, if $\delta d_2$ is greater than a predetermined value (e.g., the placement uncertainty of the polishing beam), the polishing beam parameters may again be adjusted (e.g., based on the remaining distance $\delta d_2$) and the upper facet may again be polished to close the gap between facet 202 and ABS 101. This process may be iteratively repeated until the distance remaining $d_{n+1}$ after the $n^{th}$ iteration is less than a predetermined value, such as the placement uncertainty of the polishing beam (e.g., 5 nm). Once the remaining distance is satisfactorily small, an image of the facet may be taken with a SEM disposed at an angle to the facet to determine the geometry of the device.

While in the foregoing exemplary aspects of the subject disclosure, the trenching performed to expose a cross-sectional view of a device has been described with reference to focused ion beam milling, the scope of the present invention is not limited to this particular arrangement. In accordance with other aspects of the subject disclosure, any one of a number of milling techniques well known to those of skill in the art may be used to expose a cross-sectional view of a 3D device in a wafer. Once the cross-sectional surface of the 3D device is exposed by milling, the measurement or detection of the cross-sectional view thereof may be performed using a scanning electron microscope. In accordance with other aspects of the subject disclosure, however, other imaging techniques well known to those of skill in the art may be utilized to obtain cross-sectional images of the device or to measure the dimensions thereof.

Figure 4:
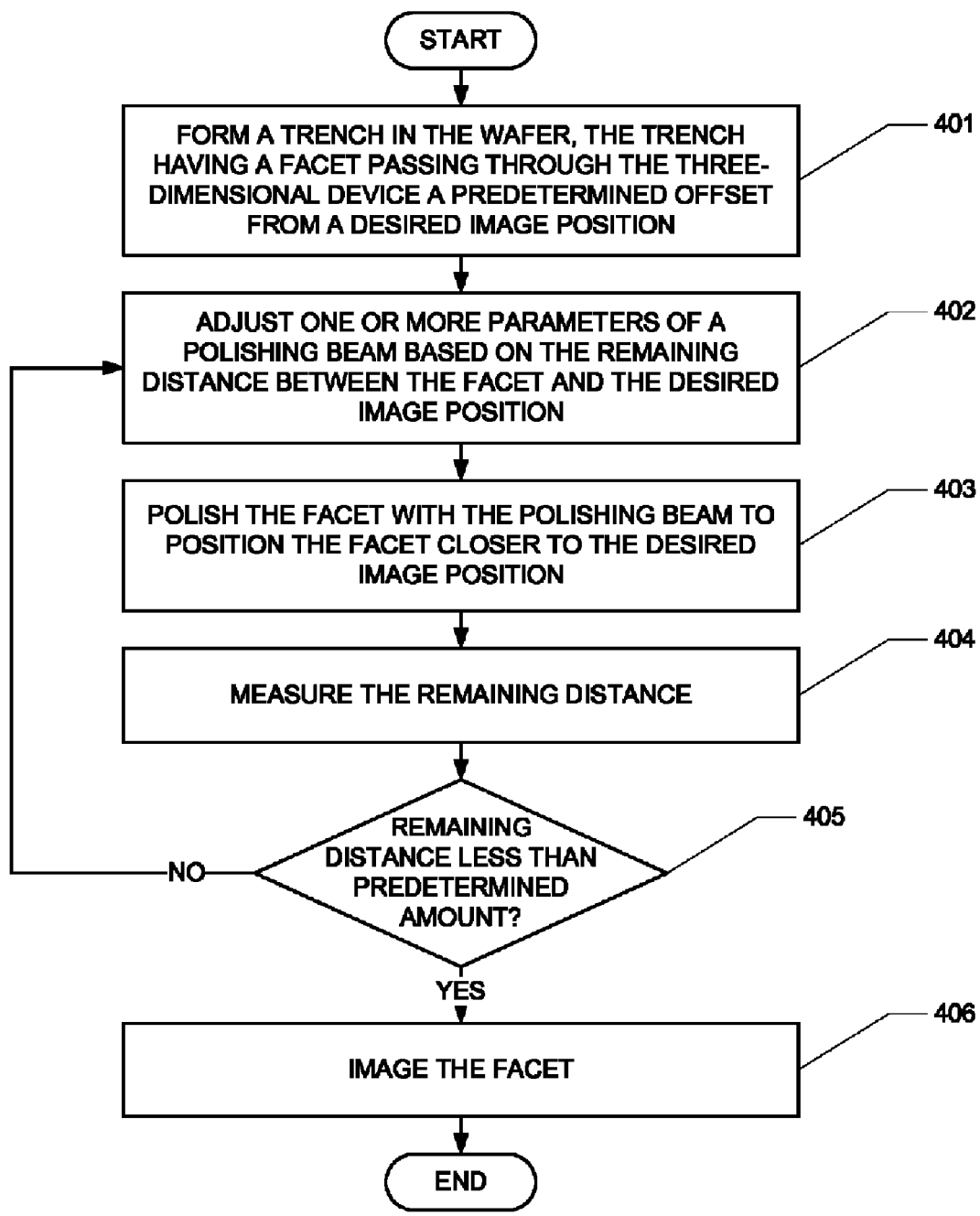
FIG. 4 is a flow chart illustrating a method of measuring a three-dimensional device in a wafer in accordance with one aspect of the subject disclosure.

FIG. 4 is a flow chart illustrating a method of measuring a three-dimensional device in a wafer in accordance with one aspect of the subject disclosure. The method begins with step 401, in which a trench is formed in the wafer, the trench having a facet passing through the three-dimensional device at a predetermined distance or offset from a desired image position in the device. In step 402, one or more parameters of a polishing beam are adjusted based upon the remaining distance between the facet and the desired image position (e.g., a beam intensity or a beam position). In step 403, the facet is polished with the polishing beam to position the facet closer to the desired image position. In step 404, the remaining distance between the repositioned facet and the desired image position is measured. As shown in decision block 405, if the remaining distance is not less than a predetermined amount, the process flow returns to step 402, and the adjusting, polishing and measuring steps are repeated. If the remaining distance is less than a predetermined amount (e.g., a placement uncertainty of the polishing beam), then the method continues to step 406, in which the facet is imaged (e.g., with an SEM device).

Figure 5:
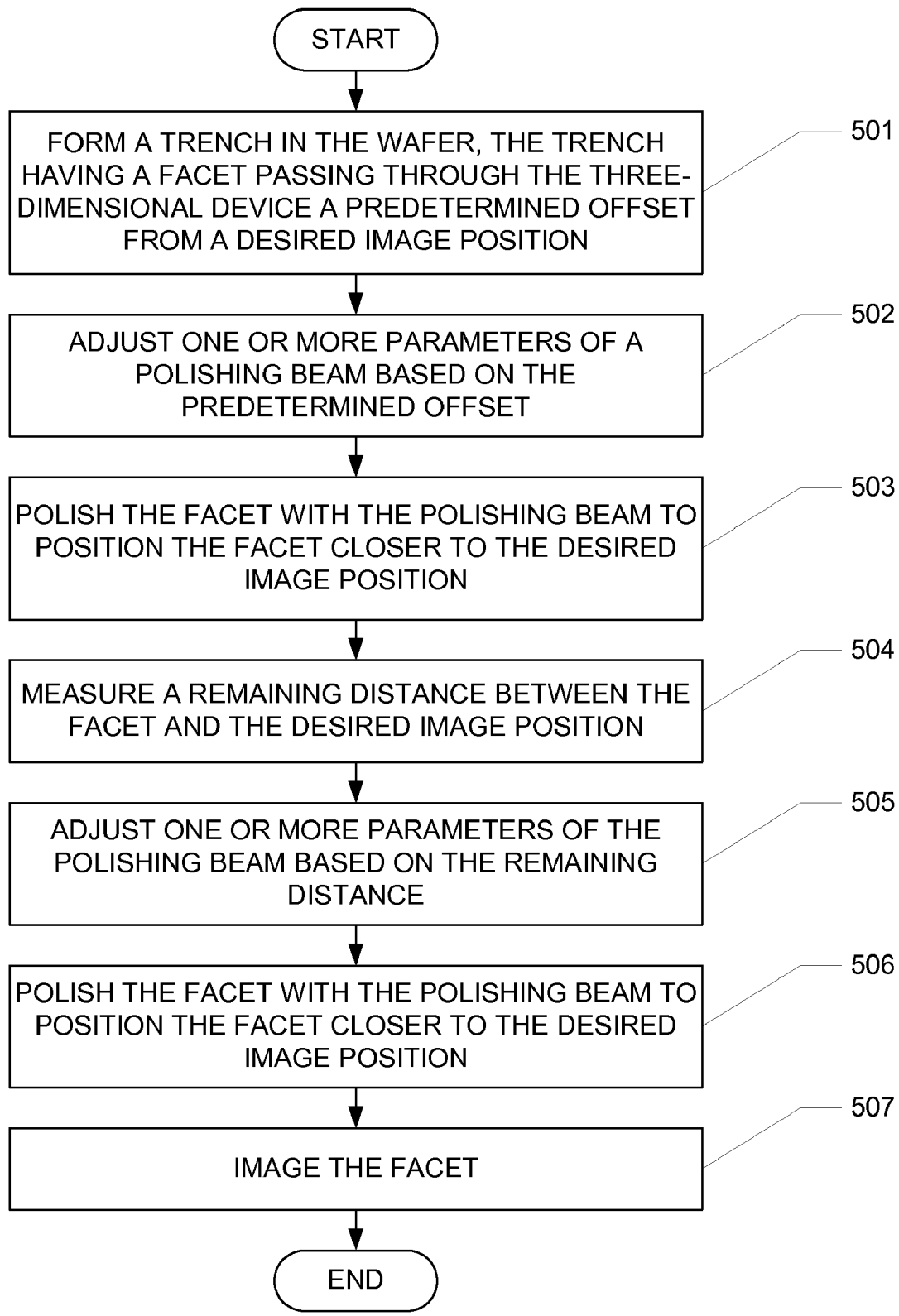
FIG. 5 is a flow chart illustrating a method of measuring a three-dimensional device in a wafer in accordance with one aspect of the subject disclosure.

FIG. 5 is a flow chart illustrating a method of measuring a three-dimensional device in a wafer in accordance with one aspect of the subject disclosure. The method begins with step 501, in which a trench is formed in the wafer. The trench has a facet passing through the three-dimensional device a predetermined offset from a desired image position. In step 502, one or more parameters of a polishing beam are adjusted based on the predetermined offset (or the remaining distance between the desired image position and the facet formed in step 501). In step 503, the facet is polished with the polishing beam to position the facet closer to the desired image position. A remaining distance between the facet and the desired image position is measured in step 504. In step 505, one or more parameters of the polishing beam are adjusted based on the remaining distance, and in step 506, the facet is again polished with the polishing beam to position the facet closer to the desired image position. In step 507, the facet is imaged (e.g., with a SEM).

While in the foregoing exemplary embodiments, the three-dimensional device measured with the foregoing methods has been depicted as a PMR write pole, the scope of the present invention is not limited to the measurement of these particular devices. Rather, as will be readily apparent to those of skill in the art, the present invention has application to the metrology of any three-dimensional device in a wafer whose cross-sectional image is desired.

Figure 6:
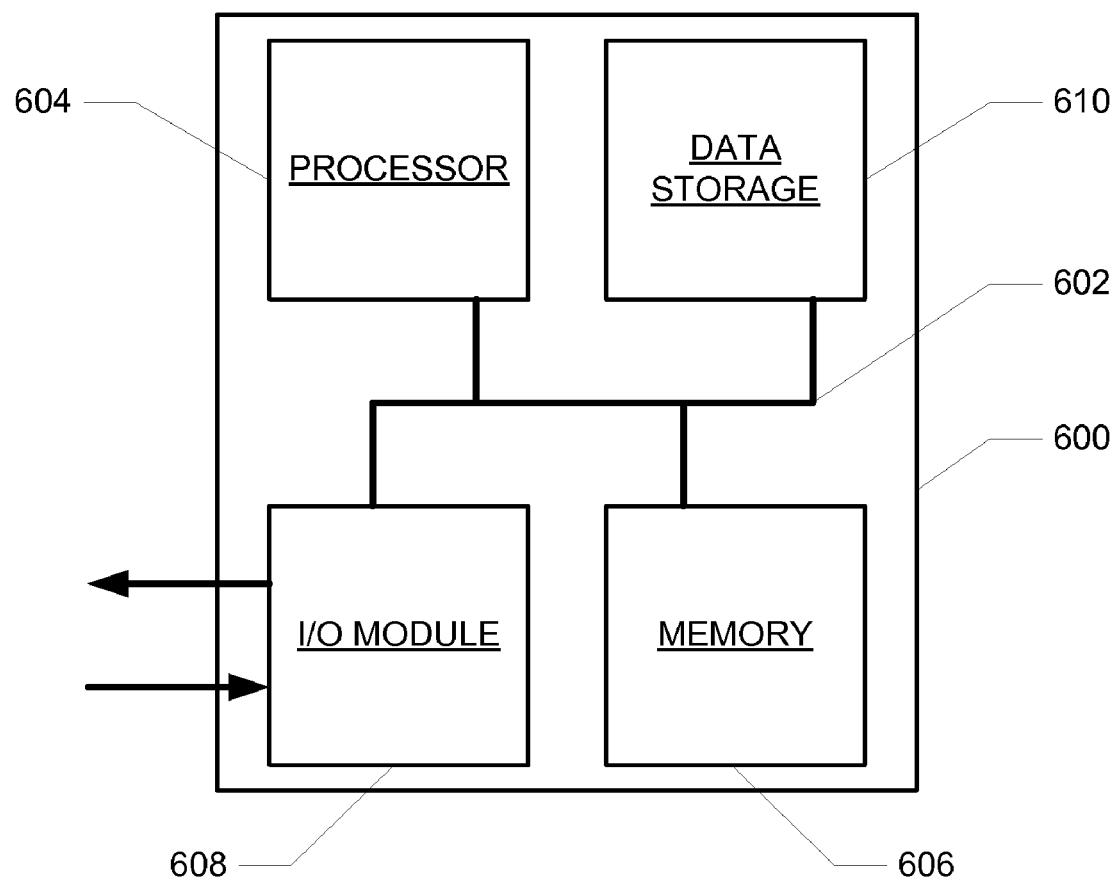
FIG. 6 is a block diagram that illustrates a computer system upon which an embodiment of the present invention may be implemented in accordance with one aspect of the subject disclosure.

FIG. 6 is a block diagram that illustrates a computer system 600 upon which an embodiment of the present invention may be implemented, in accordance with one aspect of the subject disclosure. Computer system 600 includes a bus 602 or other communication mechanism for communicating information, and a processor 604 coupled with bus 602 for processing information. Computer system 600 also includes a memory 606, such as a random access memory ("RAM") or other dynamic storage device, coupled to bus 602 for storing information and instructions to be executed by processor 604. Memory 606 may also be used for storing temporary variables or other intermediate information during execution of instructions by processor 604. Computer system 600 further includes a data storage device 610, such as a magnetic disk or optical disk, coupled to bus 602 for storing information and instructions.

Computer system 600 may be coupled via I/O module 608 to a display device (not illustrated), such as a cathode ray tube ("CRT") or liquid crystal display ("LCD") for displaying information to a computer user. An input device, such as, for example, a keyboard or a mouse may also be coupled to computer system 600 via I/O module 608 for communicating information and command selections to processor 604.

According to one aspect of the subject disclosure, measuring a three-dimensional device in a wafer is performed by a computer system 600 in response to processor 604 executing one or more sequences of one or more instructions contained in memory 606. Such instructions may be read into memory 606 from another machine-readable medium, such as data storage device 610. Execution of the sequences of instructions contained in main memory 606 causes processor 604 to perform the process steps described herein. One or more processors in a multi-processing arrangement may also be employed to execute the sequences of instructions contained in memory 606. In alternative embodiments, hard-wired circuitry may be used in place of or in combination with software instructions to implement various aspects of the subject disclosure. Thus, embodiments of the present invention are not limited to any specific combination of hardware circuitry and software.

The term "machine-readable medium" as used herein refers to any medium that participates in providing instructions to processor 604 for execution. Such a medium may take many forms, including, but not limited to, non-volatile media, volatile media, and transmission media. Non-volatile media include, for example, optical or magnetic disks, such as data storage device 610. Volatile media include dynamic memory, such as memory 606. Transmission media include coaxial cables, copper wire, and fiber optics, including the wires that comprise bus 602. Transmission media can also take the form of acoustic or light waves, such as those generated during radio frequency and infrared data communications. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, a carrier wave, or any other medium from which a computer can read.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A method of measuring a three-dimensional device in a wafer, comprising the steps of:
    forming a trench in the wafer, the trench having a facet passing through the three-dimensional device a predetermined offset from a desired image position; and
    iteratively, until a remaining distance between the facet and the desired image position is less than a predetermined threshold:
        adjusting one or more parameters of a polishing beam based on the remaining distance,
        polishing the facet with the polishing beam to position the facet closer to the desired image position, and
        measuring the remaining distance.

2. The method according to claim 1, wherein adjusting the one or more parameters of the polishing beam comprises adjusting an intensity of the polishing beam.

3. The method according to claim 1, wherein adjusting the one or more parameters of the polishing beam comprises adjusting a position of the polishing beam.

4. The method according to claim 3, wherein the position $d_2$ of the polishing beam is adjusted according to the equation:

$$d_2 = d_1 + \delta d_1 - \beta(I_0 - I),$$

where $d_1$ is a position of the facet before adjusting the position of the polishing beam, $\delta d_1$ is the remaining distance, $\beta$ is a diameter of the polishing beam, $I_0$ is an initial intensity of the polishing beam, and $I$ is an adjusted intensity of the polishing beam.

5. The method according to claim 1, further comprising the step of:
    measuring a distance between the facet and the desired image position before iteratively adjusting, polishing and measuring.

6. The method according to claim 1, further comprising the step of:
    imaging the facet after the remaining distance is less than the predetermined threshold.

7. The method according to claim 6, wherein imaging the facet comprises imaging the facet with a scanning electron microscope.

8. The method according to claim 1, wherein the trench is formed with a focused ion beam.

9. The method according to claim 1, wherein the three-dimensional device is a write pole of a magnetic recording head.

10. A method of measuring a three-dimensional device in a wafer, comprising the steps of:

forming a trench in the wafer, the trench having a facet passing through the three-dimensional device a predetermined offset from a desired image position;

adjusting one or more parameters of a polishing beam based on the predetermined offset;

polishing the facet with the polishing beam to position the facet closer to the desired image position;

measuring a remaining distance between the facet and the desired image position;

adjusting one or more parameters of the polishing beam based on the remaining distance;

polishing the facet with the polishing beam to position the facet closer to the desired image position; and imaging the facet.

11. The method according to claim 10, wherein adjusting the one or more parameters of the polishing beam comprises adjusting an intensity of the polishing beam.

12. The method according to claim 10, wherein adjusting the one or more parameters of the polishing beam comprises adjusting a position of the polishing beam.

13. The method according to claim 12, wherein the position d of the polishing beam is adjusted according to the equation:

$$d_2 = d_1 + \delta d_1 - \beta(I_0 - I),$$

where $d_1$ is a position of the facet before adjusting the position of the polishing beam, $\delta d_1$ is the remaining distance, $\beta$ is a diameter of the polishing beam, $I_0$ is an initial intensity of the polishing beam, and I is an adjusted intensity of the polishing beam.

14. The method according to claim 10, further comprising the step of:

measuring a distance between the facet and the desired image position before the first adjusting step.

15. The method according to claim 10, wherein imaging the facet comprises imaging the facet with a scanning electron microscope.

16. The method according to claim 10, wherein the trench is formed with a focused ion beam.

17. The method according to claim 10, wherein the three-dimensional device is a write pole of a magnetic recording head.

18. A machine readable medium carrying one or more sequences of instructions for measuring a three-dimensional device in a wafer, wherein execution of the one or more sequences of instructions by one or more processors causes the one or more processors to perform the steps of:

forming a trench in the wafer, the trench having a facet passing through the three-dimensional device a predetermined offset from a desired image position; and iteratively, until a remaining distance between the facet and the desired image position is less than a predetermined threshold:

adjusting one or more parameters of a polishing beam based on the remaining distance, polishing the facet with the polishing beam to position the facet closer to the desired image position, and measuring the remaining distance.

* * * * *